(12) United States Patent
Huntzicker (10) Patent No.: US 10,310,773 B2
(45) Date of Patent: Jun. 4, 2019

(54) SYSTEMS AND METHODS FOR RETAINING DATA IN A MEMORY

(71) Applicant: GM GLOBAL TECHNOLOGY OPERATIONS LLC, Detroit, MI (US)

(72) Inventor: Fred W. Huntzicker, Ann Arbor, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 1 day.

(21) Appl. No.: 15/873,064

(22) Filed: Jan. 17, 2018

(65) Prior Publication Data

US 2018/0143789 A1 May 24, 2018

Related U.S. Application Data

(63) Continuation-in-part of application No. 14/222,308, filed on Mar. 21, 2014.

(51) Int. Cl.
*G06F 3/06* (2006.01)

(52) U.S. Cl.
CPC .......... *G06F 3/0679* (2013.01); *G06F 3/0619* (2013.01); *G06F 3/0665* (2013.01)

(58) Field of Classification Search
CPC ..... G06F 3/0679; G06F 3/0619; G06F 3/0665
See application file for complete search history.

(56) References Cited

U.S. PATENT DOCUMENTS

| | | | | |
|---|---|---|---|---|
| 5,916,300 A * | 6/1999 | Kirk | ........................ | G01S 19/44 701/468 |
| 2004/0039867 A1* | 2/2004 | Apfeldorfer | .............. | G06F 5/10 711/1 |
| 2009/0113115 A1* | 4/2009 | Nazarian | ............. | G11C 11/5621 711/103 |

FOREIGN PATENT DOCUMENTS

CN     203192416 U     9/2013

OTHER PUBLICATIONS

State Intellectual Property Office of the People's Republic of China, Office Action in Chinese Patent Application No. 201510123513.6 dated Jun. 21, 2017.
USPTO, Non-Final Office Action issued in U.S. Appl. No. 14/222,308, dated Mar. 14, 2016.
Response to USPTO Non-Final Office Action for U.S. Appl. No. 14/222,308, dated Jul. 14, 2016.
USPTO, Final Office Action issued in U.S. Appl. No. 14/222,308, dated Oct. 24, 2016.
Response to USPTO Final Office Action for U.S. Appl. No. 14/222,308, dated Jan. 24, 2017.

(Continued)

*Primary Examiner* — Ann J Lo
*Assistant Examiner* — Jane Wei
(74) *Attorney, Agent, or Firm* — Lorenz & Kopf LLP (57) ABSTRACT

Methods, systems, and vehicles are provided for retaining data in a vehicle. In various embodiments, the vehicle includes a sensor, a processor, and a memory. The sensor is configured to sense an aspect of the vehicle. The processor is configured to receive data from the sensor, sample the data at a first rate and retain the data at a second rate that is less than the first rate while the vehicle is in operation. The memory is in communication with the processor, and includes a plurality of storage locations each identified with a unique address. The processor is further configured to determine a current storage location address for a latest sample of the data at the first rate such that older samples of data are retained at the second rate less frequent than the first rate while the vehicle is in operation.

14 Claims, 6 Drawing Sheets

(56) References Cited

OTHER PUBLICATIONS

USPTO, Non-Final Office Action issued in U.S. Appl. No. 14/222,308, dated Apr. 6, 2017.
Response to USPTO Non-Final Office Action for U.S. Appl. No. 14/222,308, dated Jul. 6, 2017.
USPTO, Final Office Action issued in U.S. Appl. No. 14/222,308, dated Oct. 19, 2017.

* cited by examiner

SYSTEMS AND METHODS FOR RETAINING DATA IN A MEMORY

CROSS-REFERENCES TO RELATED APPLICATIONS

This application is a continuation-in-part of U.S. application Ser. No. 14/222,308, filed on Mar. 21, 2014, the entirety of which is incorporated by reference herein.

TECHNICAL FIELD

The technical field generally relates to systems and methods for recording data in a memory, and more particularly relates to systems and methods for recording data in a memory at a plurality of sampling rates.

BACKGROUND

Data regarding operation of a vehicle is often stored to a memory device, or simply, a "memory", for later retrieval and use. One common technique for storing such data is a circular buffer where the data is recorded sequentially at a defined rate. After each recording, the address of the memory storage location is incremented, so that the memory fills up sequentially. When an upper limit of the memory is reached, the address is reset to a beginning location and data is over-written from the beginning location. The memory addresses to be written to can be expressed as:

$$Add_s = Add_{min} + T_s \bmod n$$

wherein $Add_s$ is the current address that is being written to, $Add_{min}$ is the minimum (or beginning) memory address, $T_s$ is an incrementing time sample (e.g., 0, 1, 2, 3, . . . ), and n is the number of memory locations. In this application, the notation "x mod n" will refer to the remainder of the quantity x divided by n.

One drawback of this technique is that all of the data is written at a single sampling rate. Therefore, a large memory device is required to record data for a large period of time while providing for a fast sampling rate close to an event, e.g., an airbag deployment event.

To save on the amount of storage locations that are required in a memory, it may be beneficial for older data to only be retained at a slower sampling rate while still maintaining the fast sampling rate near the event.

Accordingly, it is desirable to provide systems and methods that allows for storing data at multiple sampling rates. Furthermore, other desirable features and characteristics of the present invention will become apparent from the subsequent detailed description and the appended claims, taken in conjunction with the accompanying drawings and the foregoing technical field and background.

SUMMARY

In various embodiments, a method is provided for recording data in a memory of a vehicle having a plurality of data storage locations. In various embodiments, the method includes, while the vehicle is in operation: receiving data while the vehicle is in operation; sampling the data, and recording at a first sampling rate while the vehicle is in operation, determining a current storage location address for a latest sample of the data at the first sampling rate such that older samples of data are retained at a second sampling rate less frequent than the first sampling rate; and storing the latest sample of the data at the current storage location address.

In various embodiments, a system for recording data for a vehicle is provided. In various embodiments, the system includes a processor and a memory. The processor is configured to receive data from at least one data source, sample and record the data at a first rate, while the vehicle is in operation. The memory is in communication with the processor, and includes a plurality of storage locations each identified with a unique address. The processor is further configured to determine a current storage location address for a latest sample of the data at the first rate such that older samples of data are retained at the second rate less frequent than the first rate while the vehicle is in operation.

In various embodiments, a vehicle is provided. In various embodiments, the vehicle includes a sensor, a processor, and a memory. The sensor is configured to sense an aspect of the vehicle. The processor is configured to receive data from the sensor, sample and record the data at a first rate while the vehicle is in operation. The memory is in communication with the processor, and includes a plurality of storage locations each identified with a unique address. The processor is further configured to determine a current storage location address for a latest sample of the data at the first rate such that older samples of data are retained at the second rate less frequent than the first rate while the vehicle is in operation.

DESCRIPTION OF THE DRAWINGS

The exemplary embodiments will hereinafter be described in conjunction with the following drawing figures, wherein like numerals denote like elements, and wherein.

DETAILED DESCRIPTION

The following detailed description is merely exemplary in nature and is not intended to limit the application and uses. Furthermore, there is no intention to be bound by any expressed or implied theory presented in the preceding technical field, background, brief summary or the following detailed description.

Referring to the Figures, wherein like numerals indicate like parts throughout the several views, a system 100 and method 300 of recording data is shown and described herein. In the exemplary embodiments, the method 300 is implemented with the computerized system 100. In one exemplary embodiment, the computerized system 100 may be integrated with a vehicle 102, e.g., an automobile that is driven along roadways on land. However, it is to be appreciated that the method 300 may be implemented with other devices (not shown), including non-vehicular applications.

Figure 1:
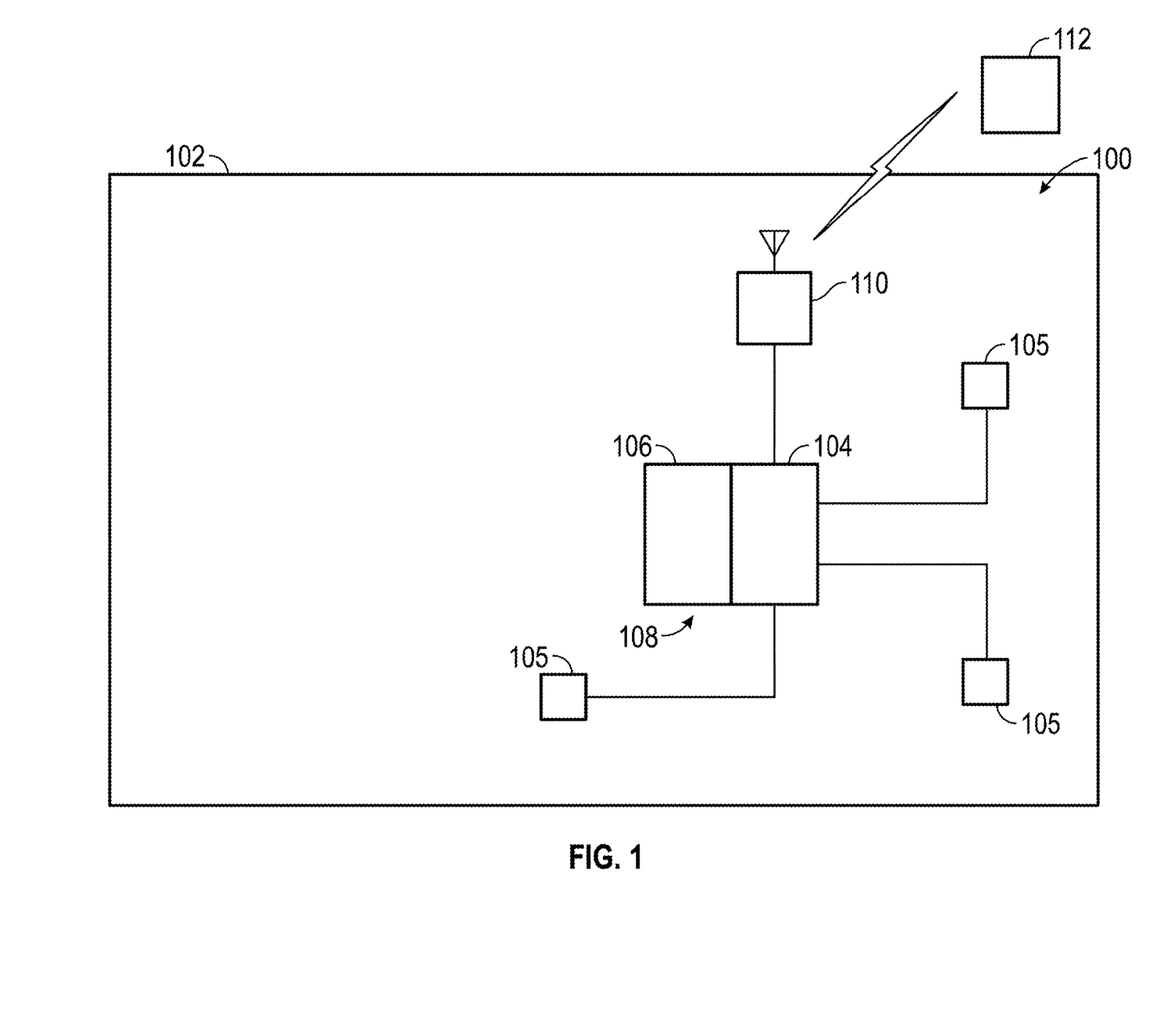
FIG. 1 is a block diagram of a system for storing data in accordance with an embodiment.

Referring to FIG. 1, the system 100 of the exemplary embodiment includes a processor 104. The processor 104 is a device capable of executing instructions (i.e., running a program) and/or performing calculations. The processor 104 may be part of an integrated circuit, i.e., a semiconductor device, as is well known to those skilled in the art. The processor 104 of the exemplary embodiment includes a plurality of inputs (not numbered) and outputs (not numbered) capable of sending and receiving signals, data, and/or other information.

The processor 104 is in communication with at least one data source 105 for receiving data. In the exemplary embodiment, the at least one data source 105 is a system or sensor related to operation of the vehicle 102. For example, the data source 105 may be an accelerometer. As such, the accelerometer provides a signal which encodes data corresponding to an acceleration/deceleration of the vehicle 102. The processor 104 may include hardware and/or software to decode the signal to obtain the data, as is well known to those skilled in the art.

Of course, the data source 105 is not limited to an accelerometer or even to vehicular applications. In another example, the data source 105 may be a temperature sensor for sensing temperature of cooling water used in an engine (not shown) of the vehicle 102. In a non-vehicle example, the data source 105 may be a wind sensor for measuring the speed of wind.

The system 100 also includes a memory 106 capable of storing data and/or other information. The memory 106 may be implemented with a semiconductor device, e.g., random access memory (RAM) or flash memory. The memory 106 may also be implemented with a magnetic storage device, e.g., a hard drive or a floppy drive. The memory 106 may further be implemented as an optical storage device, e.g., a CD-ROM or a DVD. Those skilled in the art realize other media and techniques for implementing the memory 106.

The memory 106 is in communication with the processor 104. As such, the processor 104 may communicate data received to the memory 106 for storage. In the exemplary embodiment, the memory 106 is integrated with the processor 104, i.e., part of the same integrated circuit 108. However, the memory 106 and the processor 104 may be separate and distinct components, as is readily appreciated by those skilled in the art. The vehicle 102 may also include a radio 110 in communication with the processor 104.

Figure 2:
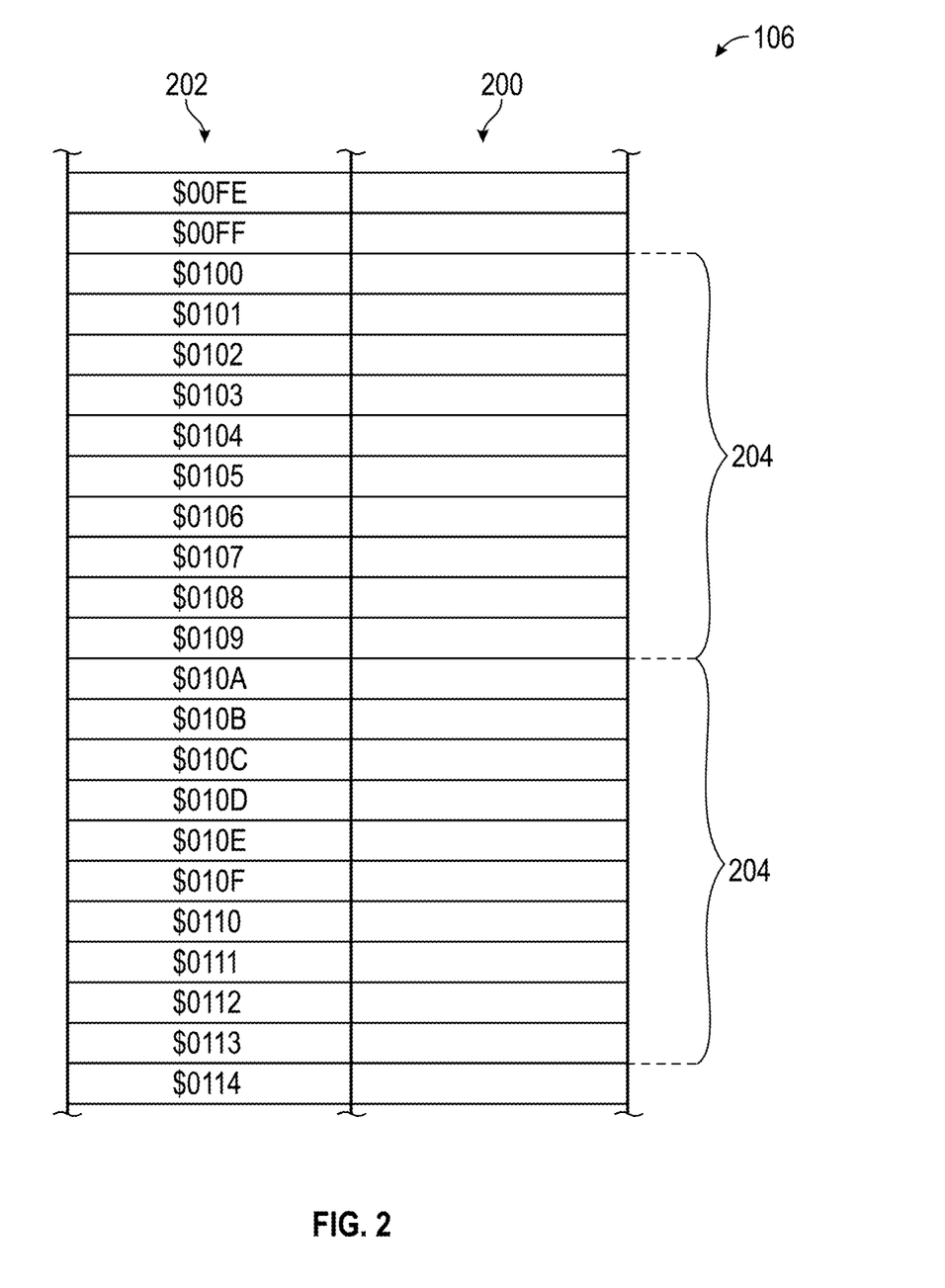
FIG. 2 is a table representing a memory in accordance with an embodiment.

Referring now to FIG. 2, the memory 106 includes a plurality of memory locations 200. The memory locations 200 are identified with unique storage location addresses 202. As such, the processor 104 is capable of storing data in specific memory locations 200 corresponding to the storage location addresses 202. A plurality of memory locations 200 may be grouped together as an array 204, wherein each of the plurality of memory locations 200 is configured to be identified via a respective unique storage location address 202. Furthermore, the memory 106 may be sectioned into a plurality of arrays 204. In various embodiments, memory locations are mixed within a contiguous range, for example in the sense that in certain embodiments the disclosed techniques creates an addressing scheme that records non-sequentially, with a specific purpose in mind.

Figure 3:
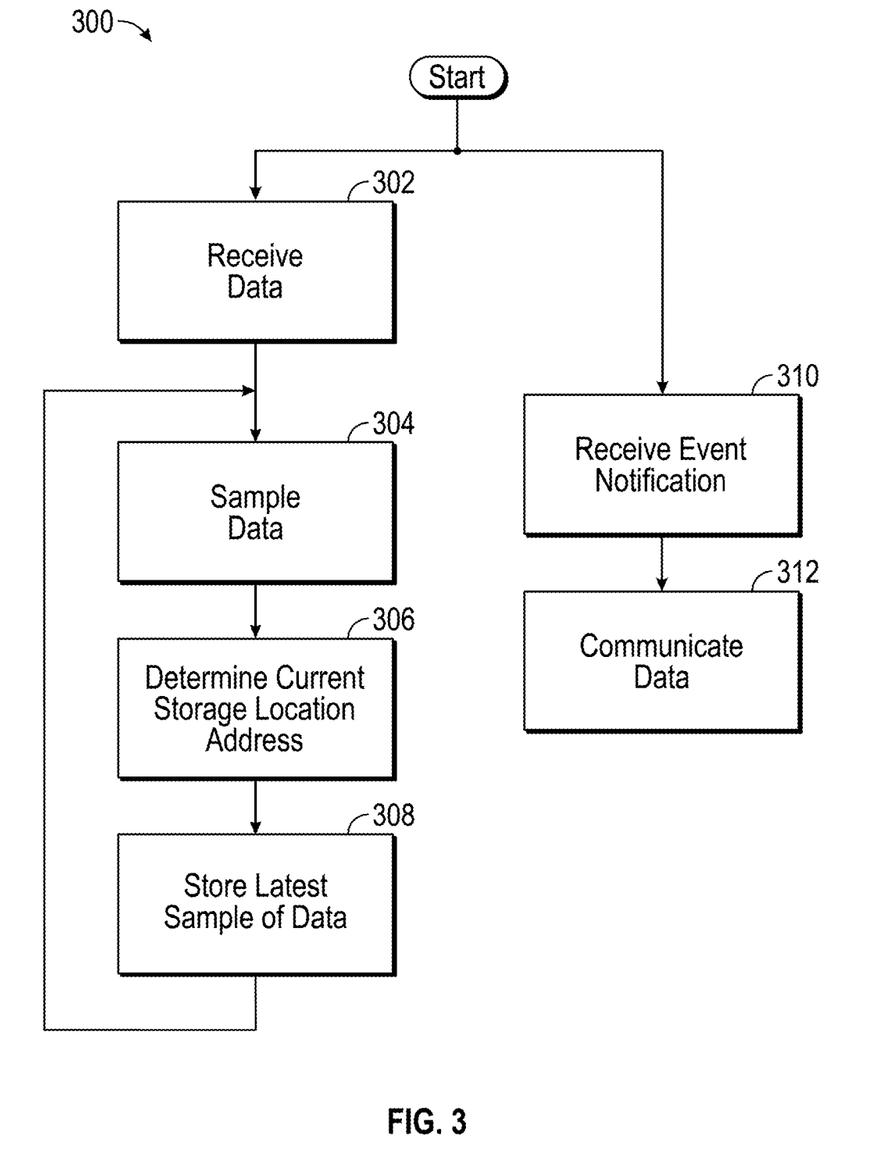
FIG. 3 is flowchart showing a method of storing data in accordance with an embodiment.

With reference to FIG. 3, and continued reference to FIGS. 1 and 2, one exemplary method 300 is shown. As can be appreciated in light of the disclosure, the order of operation within the method 300 is not limited to the sequential execution as illustrated in FIG. 3, but may be performed in one or more varying orders as applicable and in accordance with the present disclosure. As can further be appreciated, one or more steps of the method 300 may be added or removed without altering the spirit of the method 300. The method 300 shown and described herein may run substantially continuously during usage and/or operation of the vehicle 102 and/or continuously while recording is desired. However, the method 300 may alternatively run during predefined time periods or as desired by a user.

In certain embodiments, each of the steps of the method 300 is performed, preferably continuously during usage of the vehicle 102 and/or continuously while recording is desired.

The method 300, includes, at 302, receiving data. When implemented with the exemplary system 100 described above, the processor 104 is configured to receive data from the at least one data source 105. Of course, receiving data may be implemented as receiving a signal on which the data is encoded and then decoding the signal to obtain the data, as is well known to those skilled in the art. In various embodiments, step 302 is performed, preferably continuously, throughout usage and/or operation of the vehicle 102 and/or continuously while recording is desired.

In various embodiments, the received data is continually stored at a consistent, fast rate, and an addressing scheme is utilized that results in data being retained at different rates. The received data may be retained at a plurality of sampling rates. For example, in certain embodiments, newer data is retained at a first sampling rate, and older data is retained at a second sampling rate, which is less frequent than the first sampling rate. In various embodiments, the retaining of the data in this manner with different sampling rates for newer and older data, respectively, is performed, preferably continuously, throughout usage and/or operation of the vehicle 102 and/or continuously while recording is desired. In the exemplary system 100, the processor 104 obtains the data at the first sampling rate. That is, the processor 104 obtains data at predetermined periodic time period. In the exemplary embodiments, the first sampling rate is one sample per second. However, it should be appreciated that the first sampling rate may be accomplished at any time period achievable by the processor 104.

In the exemplary embodiments, the older data retained at the second sampling rate is the same data that was stored at the first sampling rate but simply maintained at the second sampling rate. Said another way, as newer data is received, one part of the older data is maintained, but another part is overwritten by the newly received data. As a result, data at multiple sampling rates is achieved. In various embodiments, this is performed, preferably continuously, throughout usage and/or operation of the vehicle 102 and/or continuously while recording is desired.

The data may be stored at more than the two sampling rates described above. In the exemplary embodiments described herein, the received data is retained at three sampling rates: the first sampling rate, the second sampling rate, and a third sampling rate. The third sampling rate is less frequent than the second sampling rate, which, as previously stated, is less frequent than the first sampling rate. Of course, any number of sampling rates may be stored utilizing the system 100 and methods 300 described herein. In various embodiments, this is performed, preferably continuously, throughout usage and/or operation of the vehicle 102 and/or continuously while recording is desired. Also in various embodiments, regardless of the sampling rates, all of the data in the present disclosure is recorded at a constant rate throughout usage and/or operation of the vehicle 102 and/or continuously while recording is desired, and is retained at different rates throughout as noted above. Also in various embodiments, the data is not transferred from one location to another.

As such, the method 300 includes sampling the received data. More specifically, the exemplary method 300 includes, at 304, sampling the data at a first sampling rate. The method 300 further includes, at 306, determining a current storage location address for a latest sample of the data at the first sampling rate such that older samples of data are retained at the second sampling rate. The method 300 also includes, at 308, storing the latest sample of the data at the current storage location address. In various embodiments, steps 304, 306, and 308 are performed, preferably continuously, throughout usage and/or operation of the vehicle 102 and/or continuously while recording is desired.

Determining the current storage location address may be performed utilizing modular arithmetic. That is, at least one mathematical computation used in determining the current storage location address involves a modulo operation.

Different techniques for determining the current storage location are described herein. In a first exemplary embodiment, determining the current data storage location address $Add_s$ is determined with the expression:

$$Add_s = Add_{min} + \left\{ \sum_{k=0}^{T_s mod ModIdx} M_{max(k-1)} \right\} + int\left(\frac{T_s}{ModIdx}\right) mod M_{max(T_s mod ModIdx)}$$

wherein $Add_{min}$ is a minimum address, ModIdx is a modula index equal to the number of arrays, $T_s$ is a consecutive integer representing the latest sample of the data, and $M_{max\ n}$ represents the size of the respective array.

NOTE: For TsmodModIdx=0, this summation will=0 as $M_{max(-1)}$ has no value.

Figure 4:
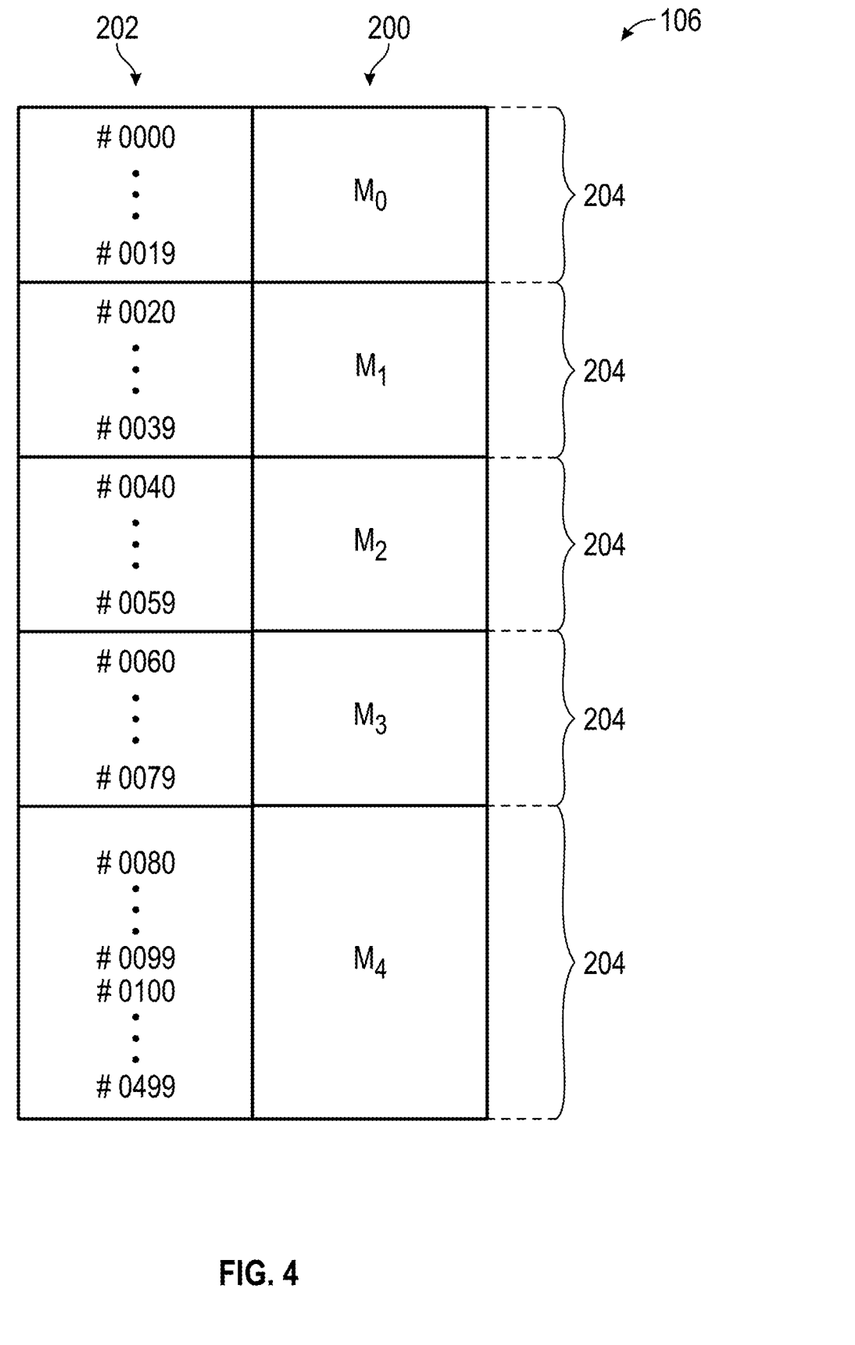
FIG. 4 is a table representing a memory in accordance with an exemplary embodiment.

In one implementation of the first exemplary embodiment, 100 samples of newer data are stored at a one sample per second (1 s/sample) sampling rate (i.e., the first sampling rate) and 400 samples of older data are stored at a one sample every five seconds (5 s/sample) sampling rate (i.e., the second sampling rate). Said another way, 100 newer data samples are stored every second and 400 older data samples are stored every five seconds. In this implementation of the first exemplary embodiment, as shown in FIG. 4, the memory 106 is partitioned into a plurality of arrays 204. More specifically, the memory 106 is partitioned into four arrays 204 labeled $M_0$-$M_3$, each having 20 data storage locations, and one array 204 labeled $M_4$ having 420 data storage locations.

Figure 5:
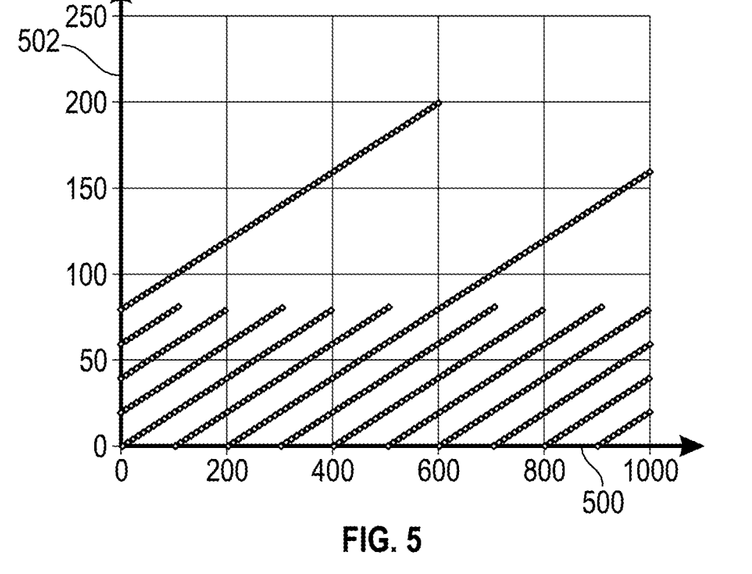
FIG. 5 is a graph showing data storage locations over time in accordance with the embodiment of FIG. 4.

In this implementation, the minimum address Add is zero and ModIdx is five. Therefore, the current data storage location address $Add_s$ proceeds as {0, 20, 40, 60, 80, 1, 21, 41, 61, 81, . . . , 19, 39, 59, 79, 99, 0, 20, 40, 60, 100, 1, 21, 41, 61, 101, . . . }. A graphical representation of the data storage addresses over time can be seen in FIG. 5, wherein the horizontal axis 500 reflects time (or $T_s$) and the vertical axis 502 reflects the data storage location addresses 202.

In accordance with the first embodiment, the values were selected such that the first rate is five times the second rate, and therefore five arrays were chosen. Also in this embodiment, one fifth (⅕) of the first rate samples (100), namely twenty (i.e., ⅕*100=20) samples per array were chosen for the first 4 arrays. Also in this embodiment, the second rate samples are combined with the last array, with four hundred twenty (i.e., 20+400=420) samples in the last array.

Also in various embodiments, this method of selecting bins can vary, and can be expanded to more than two sample rates in various embodiments. For example, in certain embodiments, (i) a first rate may include one hundred samples at one second per sample; (ii) a second rate may include four hundred samples at five seconds per sample; and (iii) a third rate may include five hundred samples at ten seconds per sample, and so on. Also in certain embodiments, in this implementation, the following array sizes can be utilized: (i) eight arrays of size ten [i.e., the first rate size (100)*the first rate (1 second)/the third rate (10 seconds)=10]; (ii) one array of size two hundred ten [i.e., the first array size, above (10)+the second rate size (400)*the second rate (5 seconds)/the third rate (10 seconds)=210]; and (iii) one array of size seven hundred ten [i.e., the second array size, above (210)+the third rate size (500)=710].

Implementing the first exemplary embodiment described above results in a memory having data at a plurality of sampling rates, while only recording data at one sampling rate, i.e., the first sampling rate. Moreover, the method of the first exemplary embodiment is fairly simple to implement in program form in the processor 104.

In a second exemplary embodiment, determining the current data storage location address $Add_s$ is determined with the expression:

$$Add_s = Add_{min} + \frac{\left\{\sum_{k=1}^{kmax}\left(int\left(\frac{T_m}{P_k}\right) * P_k * N_k\right)\right\} + T_m - 1 - T_s}{LCM} mod \sum_{k=1}^{kmax} N_k$$

wherein $Add_{min}$ is a minimum address, $T_s$ is a consecutive integer representing the latest sample of the data, LCM is the least common multiple of the sampling Periods, $T_m$=($T_s$ mod LCM)+1, $P_k$ is the sampling period, $N_k$ is the number of samples at a given $P_k$, therefore $N_k*P_k$ will equal to the number of samples if they were sampled at the fasted rate, and kmax is the total number of sampling rates to be stored. In order for the equation in this Paragraph to divide to an integer, the number of samples $N_k$ should be chosen such that they are a multiple of the least common multiple (LCM).

Figure 6:
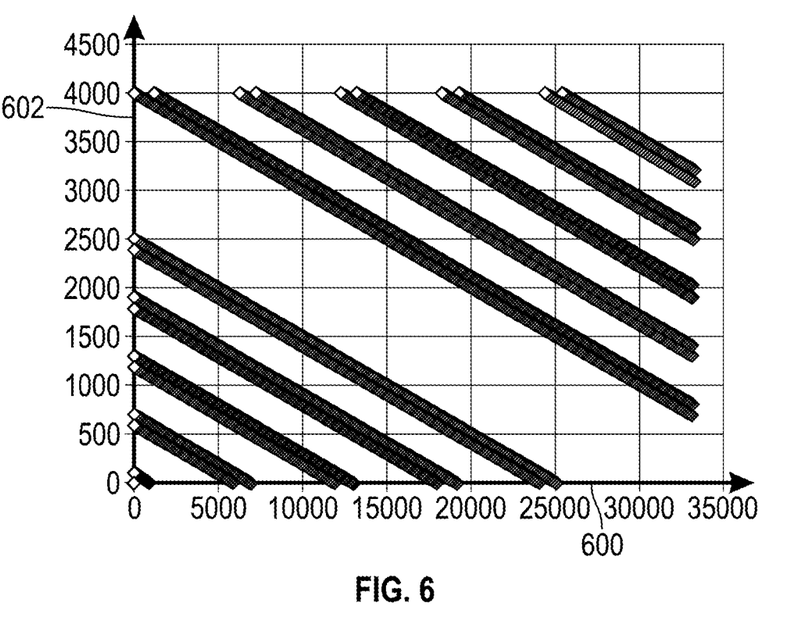
FIG. 6 is a graph showing data storage locations over time in accordance with an exemplary embodiment.

In one implementation of the second exemplary embodiment, 1000 samples of newer data are stored at a one sample per second (1 s/sample) sampling rate (i.e., the first sampling rate), 2000 samples of older data are stored at a one sample every two seconds (2 s/sample) sampling rate (i.e., the second sampling rate), and 1000 samples of even older data are stored at a one sample per 10 seconds (10 s/sample) sampling rate (i.e., the third sampling rate In this implementation, the minimum address $Add_{min}$ is zero, LCM is 10, and kmax is three. Therefore, the current data storage location address $Add_s$ proceeds as {100, 600, 700, 1200, 1300, 1800, 1900, 2400, 2500, 0, 99, 599, . . . }. A graphical representation of the data storage addresses over time can be seen in FIG. 6, wherein the horizontal axis 600 reflects time (or $T_s$) and the vertical axis 602 reflects the data storage location addresses.

Figure 7:
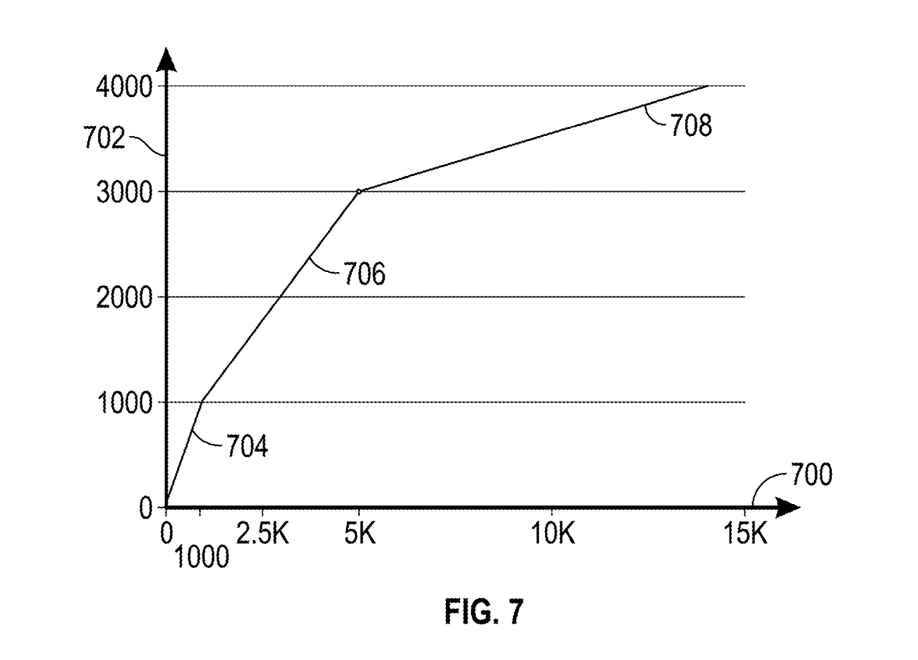
FIG. 7 is a graph showing sampling rates over time in accordance with the embodiment of FIG. 6.

The sampling rates and the quantity of data stored utilizing the second exemplary embodiment can be seen with reference to FIG. 7. Specifically, the horizontal axis 700 represents time and the vertical axis 702 represents the number of data storage locations utilized. Three sections 704, 706, 708 of a curve (not separately numbered) represent the three different sampling rates utilized in the second exemplary embodiment. Specifically, section 704 represents 1000 samples stored at one sample every second, section 706 represents 2000 samples stored at one sample every two seconds, and section 708 represents 1000 samples stored at one sample every ten sections.

Implementing the second exemplary embodiment described above also results in a memory having data at a plurality of sampling rates, while only recording data at one sampling rate, i.e., the first sampling rate. Moreover, the method of the second exemplary embodiment utilizes the same write rate at all data storage locations by cycling through the various spacing between writes at all memory locations.

Referring again to FIG. 3, the method 300 may also include, at 310, receiving an event notification. As one example, the event notification may be an indication of an impact event from an accelerometer. Other event notifications may occur due to an engine stall and/or a diagnostic code setting. Furthermore, those skilled in the art will appreciate numerous event notifications that may be generated and received.

In response to receiving the event notification, the method 300 may further include, at 312, communicating the data stored in the memory locations 200 in response to receiving the event notification. The data stored in the memory locations 200 may be sent to the radio 110 for transmission to a remote server 112, in response to the event notification. In another exemplary embodiment (not shown), the data stored in the memory locations 200 may simply be written to another section of the memory 106 for later retrieval. By sending the data in response to an event notification, the data present at the time of the event may be analyzed to determine the cause of the event and/or the reaction to the event.

In various embodiments, in the case of an event, the method 300 maintains and provides a record with varying retention rate (e.g., referring to retention of data) going back in time prior to the event. Specifically, in various embodiments, the method 300 does not modify the current logging rate in response to a current event, but rather provides a record with varying retention rate going back in time prior to the event. This can provide more robust and useful data, for example as compared with other techniques in which the logging rate is modified (e.g., because recording may terminate abruptly in the case of an event). In certain embodiments, the techniques disclosed herein may be expanded to include multiple event capability, by increasing the memory size and modifying $Add_{min}$ after each event. In certain embodiments, even when events overlap, this method will provide sample rates that meet the desired rates for each event. This is not possible using current methods. Also in various embodiments, an event is not used as a triggering event to record data, but rather to extract information (including information prior to the event) for transfer. In comparison with other art of record (which may how a change of rate can occur after an event), the present disclosure provides a change in rate prior to an event.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A method of retaining data in a memory of a vehicle having a plurality of data storage locations, the method comprising, while the vehicle is in operation:
   receiving data via a computer processor onboard the vehicle;
   sampling the data at a first sampling rate, automatically via the computer processor onboard the vehicle;
   retaining the data at a second rate that is less than the first sampling rate, via the computer processor onboard the vehicle;
   determining, via the computer processor onboard the vehicle, a current storage location address in non-transitory computer memory onboard the vehicle for a latest sample of the data at the first sampling rate such that older samples of data are retained at a second sampling rate less frequent than the first sampling rate, wherein the current storage address is determined based on a plurality of parameters for the non-transitory computer memory, including: a minimum address $Add_{min}$, a modula index ModIdx that equal to a number of arrays, and a size $M_{max}$ of a respective array; and
   storing, via the computer processor onboard the vehicle, the latest sample of the data at the current storage location address in the non-transitory computer memory onboard the vehicle;
   wherein:
   newer samples of data are automatically retained at a rate that is more frequent than the retention of older samples of data; and
   when the newer data is received, a first part of the older data is selectively maintained in the non-transitory computer memory, whereas a second part of the older data is selectively overwritten in the non-transitory computer memory by the newer data at the current storage address of the non-transitory computer memory based on the plurality of parameters for the non-transitory computer memory, including: the minimum address $Add_{min}$ the modula index ModIdx, and the size $M_{max}$ of the respective array; and
   wherein determining the current storage location address ($Add_s$) is determined with the expression:

$$Add_s = Add_{min} + \left\{ \sum_{k=0}^{T_s \bmod ModIdx} M_{max(k-1)} \right\} + \text{int}\left(\frac{T_s}{ModIdx}\right) \bmod M_{max(T_s \bmod ModIdx)}$$

wherein $Add_{min}$ is a minimum address, ModIdx is a modula index equal to the number of arrays, $T_s$ is a consecutive integer representing the latest sample of the data, and $M_{max\,n}$ represents the size of the respective array.

2. The method of claim 1, wherein determining the current storage location is performed utilizing modular arithmetic.

3. The method of claim 1, further comprising partitioning the data storage locations of the non-transitory computer memory onboard the vehicle into a plurality of arrays.

4. The method of claim 1, further comprising:
   receiving an event notification; and communicating the data stored in the data storage locations to a remote server that is remote from the vehicle, using a vehicle radio via instructions provided by the computer processor onboard the vehicle, in response to receiving the event notification.

5. The method of claim 1, wherein the steps of receiving data, sampling the data at a first sampling rate, retaining the data at a second rate that is less than the first rate, determining a current storage location address for a latest sample of the data at the first sampling rate such that older samples of data are retained at a second sampling rate less frequent than the first sampling rate, and storing the latest sample of the data at the current storage location address are performed continuously throughout operation of the vehicle.

6. The method of claim 1, wherein the data is recorded at a constant rate throughout usage of the vehicle, at a recording rate that is different from the second rate.

7. A vehicle, comprising:
a sensor configured to sense an aspect of the vehicle;
a processor configured to receive data from the sensor, sample the data at a first rate and retain the data at a second rate that is less than the first rate while the vehicle is in operation;
a memory in communication with the processor, the memory including a plurality of storage locations each identified with a unique address;
wherein the processor is further configured to determine a current storage location address in the memory for a latest sample of the data at the first rate such that older samples of data are retained at the second rate less frequent than the first rate while the vehicle is in operation, wherein the current storage address is determined based on a plurality of parameters for the non-transitory computer memory, including: a minimum address $Add_{min}$, a modula index ModIdx that equal to a number of arrays, and a size $M_{max}$ of a respective array; and
wherein the latest sample of data is received, a first part of the older samples of data is selectively maintained in the non-transitory computer memory, whereas a second part of the older samples of data is selectively overwritten in the non-transitory computer memory by the latest sample of data at the current storage address of the non-transitory computer memory based on the plurality of parameters for the non-transitory computer memory, including: the minimum address $Add_{min}$, the modula index ModIdx, and the size $M_{max}$ of the respective array; and
wherein the processor is configured to determine the current storage location address ($Add_s$) with the expression:

$$Add_s = Add_{min} + \left\{ \sum_{k=0}^{T_s mod ModIdx} M_{max(k-1)} \right\} + \text{int}\left(\frac{T_s}{ModIdx}\right) mod M_{max(T_s mod ModIdx)},$$

wherein $Add_{min}$ is a minimum address, ModIdx is a modula index equal to the number of arrays, $T_s$ is a consecutive integer representing the latest sample of the data, and $M_{max}$ n represents the size of the respective array.

8. The vehicle of claim 7, wherein the processor is configured to receive the data, sample the data at a first sampling rate, retain the data at a second rate that is less than the first rate, determine a current storage location address for a latest sample of the data at the first sampling rate such that older samples of data are retained at a second sampling rate less frequent than the first sampling rate, and store the latest sample of the data at the current storage location address are performed continuously throughout operation of the vehicle.

9. The vehicle of claim 7, wherein the data is recorded at a constant rate throughout usage of the vehicle, at a recording rate that is different from the second rate.

10. The method of claim 1, further comprising:
receiving a vehicle event notification; and
in response to the vehicle event notification, maintaining and providing a record with varying retention rates for retention of data, going back in time prior to the vehicle event, via instructions provided by the computer processor onboard the vehicle.

11. The method of claim 10, wherein the varying retention rates as a function of time are stored prior to the vehicle event notification.

12. The vehicle of claim 7, further comprising:
a receiver configured to receive a vehicle event notification; and
the processor is configured, in response to the vehicle event notification, maintain in the memory and provide a record with varying retention rates for retention of data, going back in time prior to the vehicle event, via instructions provided by the computer processor onboard the vehicle.

13. A method of retaining data in a memory of a vehicle having a plurality of data storage locations, the method comprising, while the vehicle is in operation:
receiving data via a computer processor onboard the vehicle;
storing, via the computer processor onboard the vehicle, the latest sample of the data at a current storage location address at a constant storing rate to a non-transitory computer memory onboard the vehicle, wherein the current storage location address ($Add_s$) with the expression:

$$Add_s = Add_{min} + \left\{ \sum_{k=0}^{T_s mod ModIdx} M_{max(k-1)} \right\} + \text{int}\left(\frac{T_s}{ModIdx}\right) mod M_{max(T_s mod ModIdx)}$$

wherein $Add_{min}$ is a minimum address, ModIdx is a modula index equal to the number of arrays, $T_s$ is a consecutive integer representing the latest sample of the data, and $M_{max\ n}$ represents the size of the respective array; and
retaining the data at a plurality of retaining rates, each of the second rates being less than the first rate;
wherein newer samples of data are automatically retained at a first sampling rate, and older samples of data are automatically retained at a second sampling rate that is less frequent than the first sampling rate; and
wherein, when the newer data is received, a first part of the older data is maintained in the non-transitory computer memory, whereas a second part of the older data is overwritten in the current storage location non-transitory computer memory by the newer data as determined by the expression, based on the minimum address $Add_{min}$, the modula index ModIdx, and the equal to the number of arrays, $T_s$ the consecutive integer representing the latest sample of the data, and represents the size $M_{max\ n}$ of the respective array.

14. The method of claim 13, further comprising:
receiving a vehicle event notification; and
in response to the vehicle event notification, maintaining and providing a record with varying retention rates for retention of data, going back in time prior to the vehicle event, via instructions provided by the computer processor onboard the vehicle;
wherein the varying retention rates as a function of time are stored prior to the vehicle event notification.

\* \* \* \* \*